United States Patent [19]

Yokoyama

[11] 4,222,012

[45] Sep. 9, 1980

[54] AMPLIFIER DEVICE

[75] Inventor: Kenji Yokoyama, Hamamatsu, Japan

[73] Assignee: Nippon Gakki Seizo Kabushiki Kaisha, Hamamatsu, Japan

[21] Appl. No.: 915,675

[22] Filed: Jun. 15, 1978

[30] Foreign Application Priority Data

Jun. 29, 1977 [JP] Japan ............................ 52/85657[U]

[51] Int. Cl.$^2$ ............................................. H03F 1/34
[52] U.S. Cl. ........................................ 330/85; 330/107; 330/149
[58] Field of Search .................. 328/156; 330/85, 149, 330/109, 294, 304, 303; 333/28 R

[56] References Cited

U.S. PATENT DOCUMENTS 3,825,854  7/1974  Pichal ................................. 330/149
4,105,945  8/1978  Sano et al. ......................... 330/294

Primary Examiner—James B. Mullins
Attorney, Agent, or Firm—Kane, Dalsimer, Kane, Sullivan and Kurucz

[57] ABSTRACT

In an amplifier device having a resistor inserted between an input terminal and the ground, a signal whose phase is opposite to that of an input signal is applied to the resistor, whereby the effect of thermal noise which may be generated by the resistor is minimized to improve the S/N ratio.

7 Claims, 8 Drawing Figures

AMPLIFIER DEVICE

BACKGROUND OF THE INVENTION

This invention relates to a low noise amplifier in which the deterioration of its S/N ratio due to thermal noise is prevented.

In a conventional non-inversion amplifier, as shown in FIG. 1 its gain is determined by a resistor 2 connected between the inversion input terminal of an operational amplifier 1 and the ground and a feedback resistor 3 connected between the output terminal and the inversion input terminal of the operational amplifier 1, and an offset bias resistor 4 is connected between the non-inversion input terminal of the amplifier 1 and the ground. This resistor 4 generates a thermal noise voltage $-\overline{en}$ as indicated in an equivalent circuit in FIG. 2. The magnitude of the thermal noise voltage can be expressed by the following Equation (1) according to the Nyquist Johnson's equation:

$$En = \sqrt{4KT\Delta fRa} \tag{1}$$

where Ra is the resistance of the resistor 4, K is the Boltzmann's constant, T is the absolute temperature, and $\Delta f$ is the band width.

When a signal source 5 is connected across an input terminal a and a grounded input terminal b of the non-inversion amplifier in FIG. 1, the noise voltage $-\overline{eni}$ across the input terminals a and b is expressed as follows:

$$Eni = \overline{En} \cdot \frac{Rg}{Ra + Rg} \tag{2}$$

$$= \frac{Ra \cdot Rg}{Ra + Rg} \sqrt{\frac{4KT\Delta f}{Ra}}$$

where Rg is the impedance of the signal source. Accordingly, this can be expressed by an equivalent circuit as shown in FIG. 3.

If the signal source 5 is a tape recorder head or a phonograph pickup cartridge for instance, its impedance contains an inductance component or a capacitance component, and accordingly the optimum damping resistance is provided by means of the resistor 4. In the case where resistance Ra of the resistor 4 should be much smaller than impedance Rg of the signal source 5 (Ra<<Rg), the S/N ratio is markedly deteriorated as is apparent from Equation (2).

SUMMARY OF THE INVENTION

Accordingly, an object of this invention is to provide a low noise amplifier in which the resistance of a resistor inserted between an input terminal and a grounded input terminal can be set to a very high value to minimize the effect of thermal noise generated by the resistor thereby improving the S/N ratio of the amplifier and in which the input impedance of the amplifier can be set to a desired value.

The foregoing object of the invention is achieved by the provision of an amplifier device comprising: an amplifier having a resistor inserted between an input terminal and the ground; and a circuit for supplying a signal whose phase is opposite to that of an input signal of the amplifier to the resistor.

The nature, utility and principle of the invention will become more apparent from the following detailed description of the preferred embodiments and the appended claims when read in conjunction with the accompanying drawings, in which like parts are designated by like reference numerals or characters.

DETAILED DESCRIPTION OF THE PREFERRED EMBODIMENTS

Figure 1:
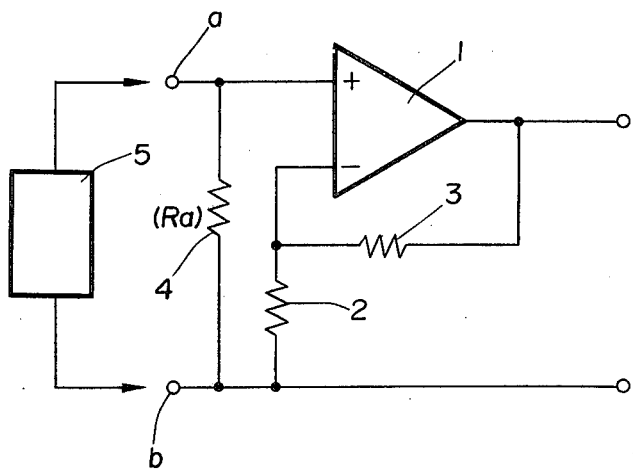
FIG. 1 is a schematic circuit diagram illustrating a conventional non-inversion amplifier.
Figure 2:
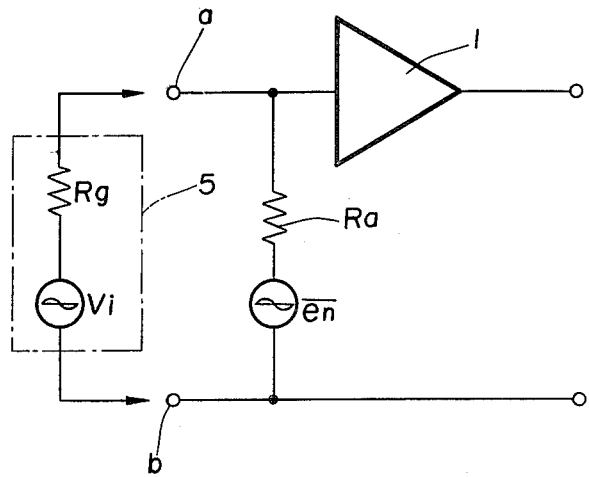
FIG. 2 shows an equivalent circuit of the circuit shown in FIG. 1.
Figure 3:
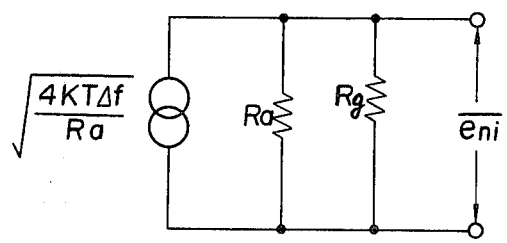
FIG. 3 shows an equivalent circuit of an input section where an external voltage source is connected to the circuit shown in FIG. 1 or 2.
Figure 4:
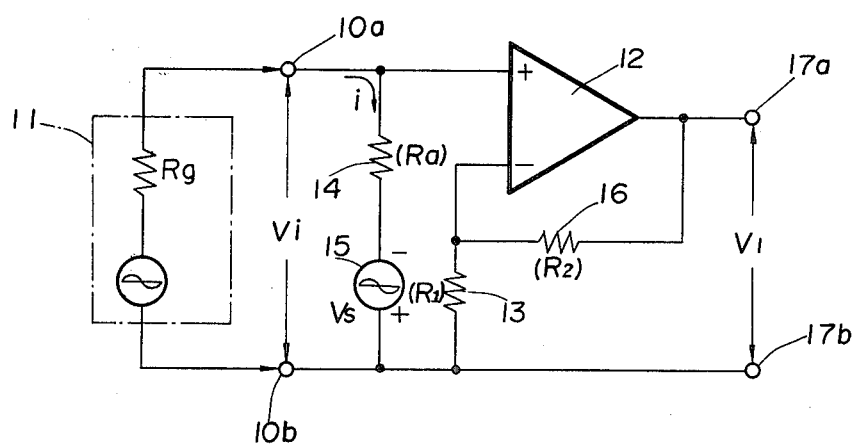
FIG. 4 is a schematic circuit diagram for a description of the principle of a non-inversion amplifier according to this invention.

FIG. 4 illustrates the principle of a non-inversion amplifier circuit according to this invention. Referring to FIG. 4, a signal source 11 is connected between an input terminal 10a and a grounded terminal 10b so as to apply an input voltage Vi across the terminals 10a and 10b. The input terminals 10a and 10b are connected to the non-inversion input terminal of an amplifier 12 and to a ground potential line, respectively. The inversion input terminal of the amplifier 12 is connected through a resistor 13 to the ground potential line. An offset bias resistor 14 is inserted between the non-inversion input terminal of the amplifier 12 and the ground line. A voltage source 15 adapted to generate a voltage Vs whose phase is opposite to that of the aforementioned input voltage Vi is connected in series between the resistor 14 and the ground line. A feedback resistor 16 is connected between the output terminal of the amplifier 12 and the inversion input terminal of the amplifier 12. The gain of the amplifier 12 is determined by the resistor 16 and the resistor 13. In FIG. 4, reference characters 17a and 17b designate an output terminal and a grounded output terminal, respectively.

The input current i of the non-inversion amplifier circuit can be expressed by the following Equation (3) where Ra is the resistance of the resistor 14:

$$i = Vs + Vi/Ra \tag{3}$$

The input impedance Zi thereof can be expressed by the following Equation (4):

$$Zi = Vi/i = Ra \cdot Vi/Vs + Vi = Ra/(1 + Vs/Vi) \tag{4}$$

If $$Vs = A \cdot Vi \text{ (where A is a real number)} \tag{5},$$

then $$Zi = Ra/(1+A) \tag{6}$$

Accordingly, the value Ra of the resistor 14 can be considerably increased, namely (1+A) times larger than that in the conventional amplifier so that the effect of thermal noise can be minimized. Therefore, a high S/N ratio can be obtained, and in addition a desired impedance can be obtained by setting the value A to a suitable value.

Figure 5:
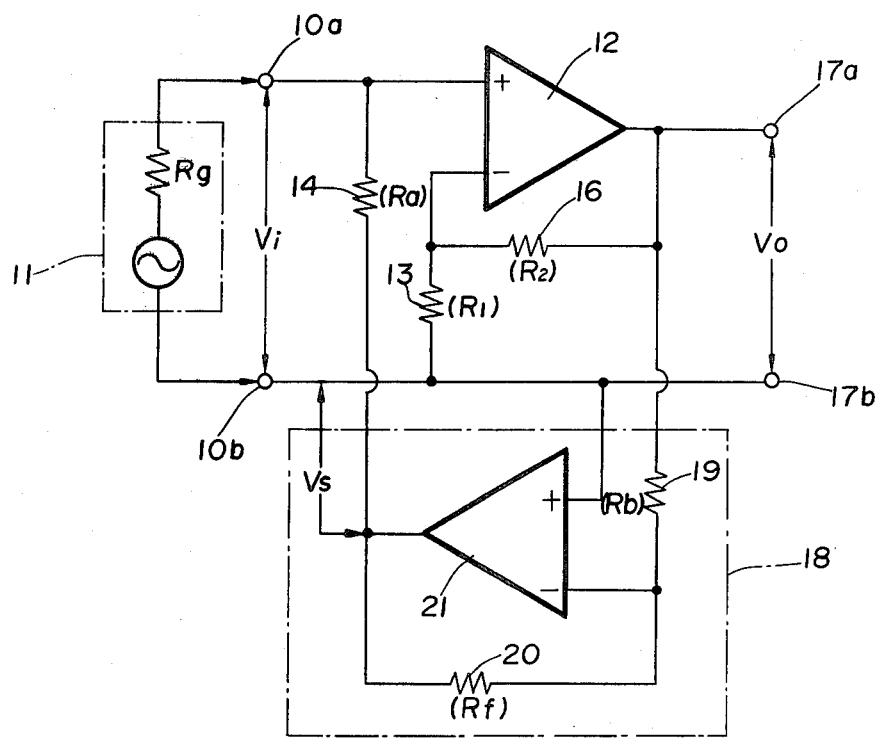
FIG. 5 is a schematic circuit diagram illustrating one example of a non-inversion amplifier formed according to the principle shown in FIG. 4.

FIG. 5 shows a concrete example of the voltage source 15 in the non-inversion amplifier illustrated in FIG. 4. In this example, the aforementioned voltage source 15 comprises an inversion amplifier 18 which has an operational amplifier 21. The non-inversion input terminal of the operational amplifier 21 is connected to the ground line, while the non-inversion input terminal of the same 21 is connected through a resistor 19 to the output terminal 17a. The output terminal of the operational amplifier 21 is connected to the resistor 14. A feedback resistor 20 is connected between the output terminal and the inversion input terminal of the amplifier 21.

Assuming that the resistance of the resistor 13, the resistance of the resistor 16, and the output voltage are $R_1$, $R_2$ and Vo, respectively, the transfer characteristic of the amplifier shown in FIG. 5 can be expressed by the following Equation (7), and the same gain as that of an ordinary non-inversion amplifier can be obtained.

$$Au = Vo/Vi \approx 1 + R_2/R_1 \quad (7)$$

If the resistance of the resistor 19 is Rb and the resistance of the feedback resistor 20 is Rf, then $$Vs/Vi \approx (1+R_2/R_1) \cdot Rf/Rb \quad (8)$$

Equation (8) corresponds to A in Equation (5), therefore $$A = (1+R_2/R_1) \cdot Rf/Rb \quad (9)$$

Thus, the value of the resistor 14 can be extremely increased by suitably selecting the values $R_1$, $R_2$, Rb and Rf of the resistors 13, 16, 19 and 20. Therefore, it is possible to increase the S/N ratio and to obtain the input impedance as desired.

If Rf=Rb in Equation (8), then $$A = (1+R_2/R_1) \quad (10)$$

Accordingly, the resistance of the resistor 14 can be multiplied by the gain of the amplifier shown in FIG. 5 and therefore it is possible to improve the S/N ratio.

Figure 6:
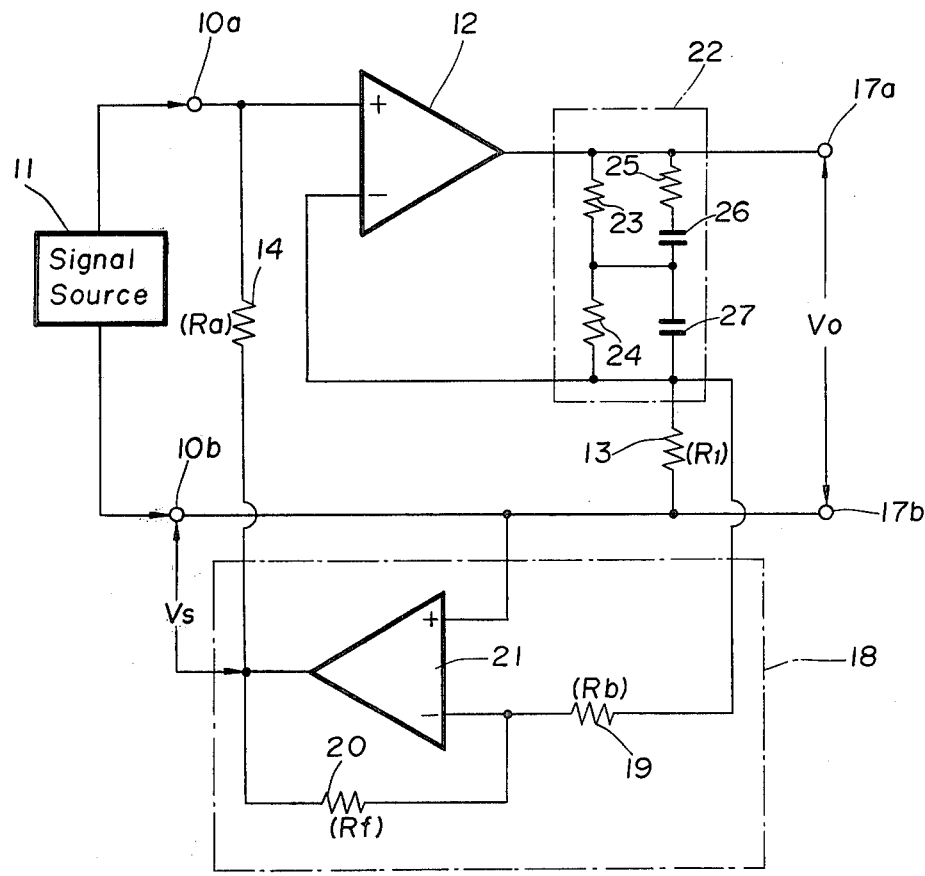
FIGS. 6 through 8 are schematic circuit diagrams showing embodiments of the invention in which the technical concept of the invention is applied to an equalizer amplifier in a low frequency preamplifier.
Figure 7:
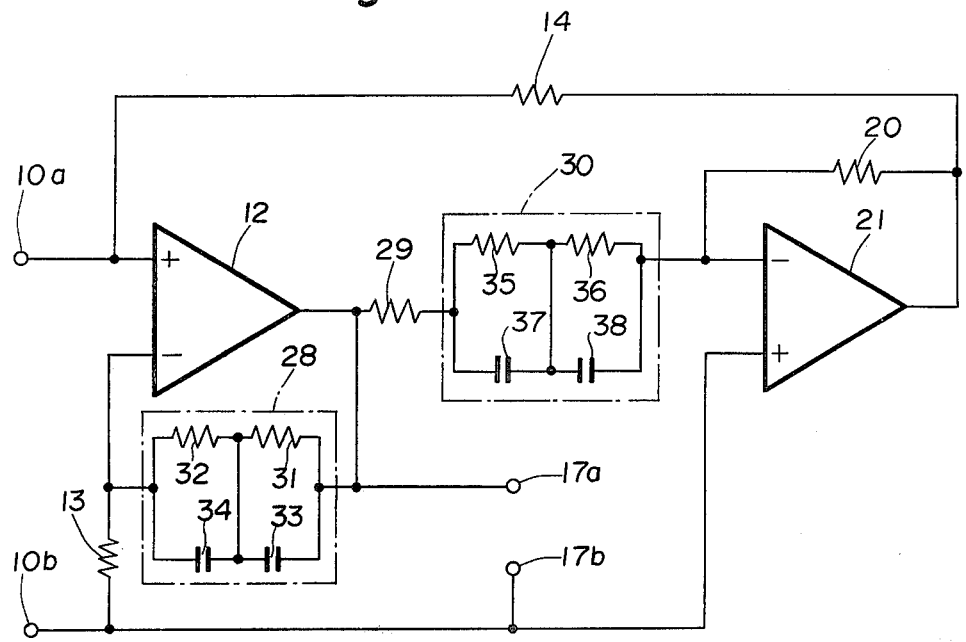
Figure 8:
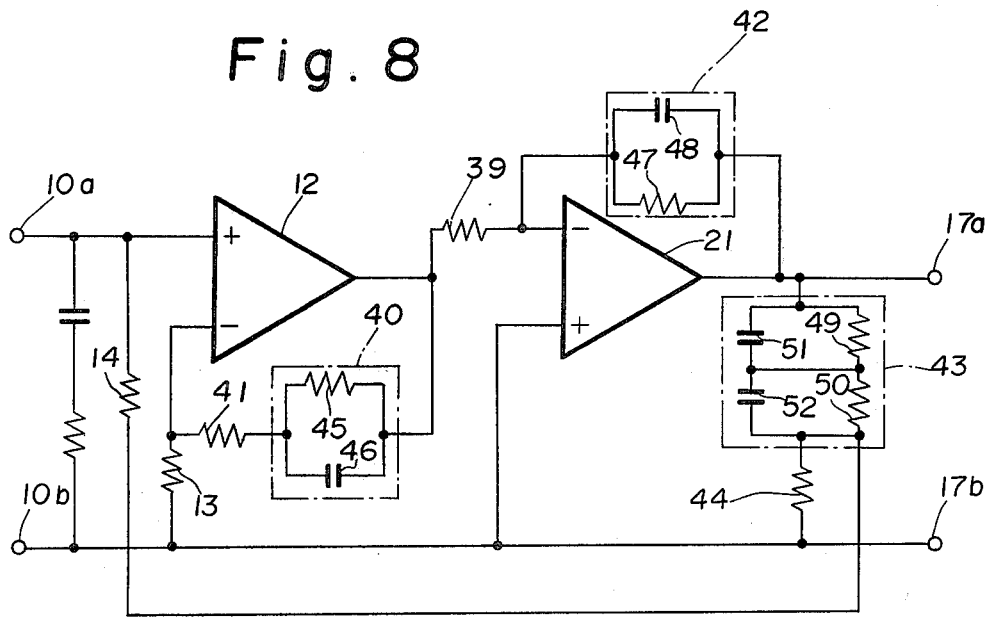

FIGS. 6 through 8 illustrate embodiments of this invention in which the technical concept of the invention is applied to an equalizer amplifier in a low frequency preamplifier.

In the circuitry shown in FIG. 6, a filter 22 having a predetermined frequency characteristic is connected in place of the feedback resistor 16 in the circuitry shown in FIG. 5, and an equalizer characteristic is imparted to the output signal with the aid of the filter 22.

The filter 22 comprises: two resistors 23 and 24 series-connected between the output terminal and the inversion input terminal of the amplifier 12; a series circuit of a resistor 25 and a capacitor 26, which is connected in parallel to the resistor 23; and a capacitor 27 connected in parallel to the resistor 24. In order that the output voltage of the inversion amplifier 18 may not vary with the frequency variation, the inversion input terminal of the amplifier 21 is connected through a resistor 19 to the connection point of the filter 22 and the resistor 13.

Similarly as in the circuitry shown in FIG. 5, in the circuitry shown in FIG. 6 the resistance of the resistor 14 can be set to a very high value, and accordingly the effect of thermal noise can be greatly reduced, and the S/N ratio can be improved. In addition, even in the case where the signal source 11 connected between the input terminal 10a and the grounded input terminal 10b is a phonograph pickup cartridge or a tape recorder head which has an inductance component or a capacitance component, a desired input resistance can be equivalently obtained by suitably selecting the values of the resistors 13, 19 and 20. Therefore, the optimum damping resistance can be set up.

The circuitry shown in FIG. 7 can be obtained by inserting a filter 28 in place of the feedback resistor 16 in FIG. 5 and by inserting a series circuit of a resistor 29 and a filter 30 in place of the resistor 19 in FIG. 5. In this case, a frequency response characteristic according to the RIAA playback standard is imparted to the amplifier circuit with the aid of the filters 28 and 30. The filter 28 is made up of resistors 31 and 32 series-connected between the output terminal and the inversion input terminal of the amplifier 12, and capacitors 33 and 34 which are parallel-connected to the resistors 31 and 32, respectively. The filter 30 comprises resistors 35 and 36 series-connected between one end of a resistor 29 having the other end connected to the output terminal of the amplifier 12 and the inversion input terminal of the amplifier 21, and capacitors 37 and 38 which are connected in parallel to the resistors 35 and 36, respectively.

FIG. 8 illustrates one embodiment of this invention in which the technical concept of the invention is applied to an equalizer amplifier, which is, in its entirety, formed to be an inversion amplifier. More specifically, in the circuit shown in FIG. 8, an amplifier 12 serves as a non-inversion amplifier, the output of which is applied through a resistor 39 to an inversion input terminal of an amplifier 21 operating as an inversion amplifier. The inversion output provided at the output terminal of the amplifier 21 is obtained across the output terminals 17a and 17b. The feedback circuit of the amplifier 12 is formed with a series circuit of a filter 40 and a resistor 41, while the feedback circuit of the amplifier 21 is formed with a filter 42. A series circuit of a filter 43 and a resistor 44 is connected between the output terminals 17a and 17b. Thus, a signal whose phase is opposite to that of an input signal obtained by a voltage divider circuit consisting of the filter 43 and the resistor 44 is applied through the resistor 14 to the non-inversion input terminal of the amplifier 12.

The filter 40 comprises a resistor 45 and a capacitor 46 which are parallel-connected between the output terminal of the amplifier 12 and one end of a resistor 41 having the other end connected to the inversion input terminal of the amplifier 12. The filter 42 is made up of a parallel circuit of a resistor 47 and a capacitor 48, which is connected between the output terminal and the inversion input terminal of the amplifier 21. The filter 43 comprises; resistors 49 and 50 which are series-connected between the output terminal 17a and one end of a resistor 44 having the other end connected to the output terminal 17b; and capacitors 51 and 52 which are connected in parallel to the resistors 49 and 50, respectively. With the aid of these filters 40, 42 and 43, a frequency response characteristic according to the RIAA playback standard is imparted to the output signal provided across the output terminals 17a and 17b.

It is apparent that the technical concept of the invention can be applied to not only an amplifier comprising an operational amplifier but also an ordinary amplifier comprising bipolar transistors, field-effect transistors or the like.

As is clear from the above description, in this invention, a signal whose phase is opposite to an input signal is applied to the resistor inserted between the input terminal and the grounded input terminal of the amplifier, and therefore it is possible to increase the resistance of the resistor. Accordingly, the effect of thermal noise can be minimized and the S/N ratio can be improved. Furthermore, for the same reason, the input impedance can be set to a desired value. Therefore, even it a signal source having an inductance component or a capacitance component is connected to the input terminal, the optimum damping resistance can be obtained.

What is claimed is:

1. An amplifier comprising:
   an amplifier circuit having a noninverting input terminal, an inverting input terminal and an output terminal, said noninverting input terminal being receptive of an input signal from a signal source circuit;
   a first feedback path connecting the output terminal and the inverting input terminal of said amplifier circuit;
   resistance means having a resistance value sufficiently larger than an impedance value of said signal source circuit and connected at one end to said noninverting input terminal of said amplifier circuit; and means connected to the other end of said resistance means for supplying to said resistance means a signal opposite in phase to said input signal so as to cause said amplifier circuit to have an input impedance which is smaller than the resistance of said resistance means to be suited for said signal source circuit.

2. An amplifier comprising:
   a first amplifier circuit having a noninverting input terminal, an inverting input terminal and an output terminal, said noninverting input terminal being receptive of an input signal from a signal source circuit;
   a first feedback path connecting the output terminal and the inverting input terminal of said first amplifier circuit;
   resistance means connected to said noninverting input terminal of said first amplifier circuit;
   means for supplying to said resistance means with a signal which is opposite in phase to said input signal, said signal supplying means comprising a second amplifier circuit having a noninverting input terminal, an inverting input terminal and an output terminal, said inverting input terminal of said second amplifier circuit being coupled with the output terminal of said first amplifier circuit and said output terminal of said second amplifier circuit being coupled with said resistance means; and a second feedback path which connects said inverting input terminal of said second amplifier circuit with said output terminal of said second amplifier circuit.

3. An amplifier comprising:
   a first amplifier circuit having a noninverting input terminal, an inverting input terminal and an output terminal, said noninverting input terminal being receptive of an input signal from a signal source circuit;
   a first feedback path which includes a first filter circuit connecting the output terminal and the inverting input terminal of said first amplifier circuit;
   resistance means connected to said noninverting input terminal of said first amplifier circuit;
   means for supplying to said resistance means with a signal which is opposite in phase to said input signal, said signal supplying means comprising a second amplifier circuit having a noninverting input terminal, an inverting input terminal and an output terminal, said inverting input terminal of said second amplifier circuit being coupled with the output terminal of said first amplifier circuit and said output terminal of said second amplifier circuit being coupled with said resistance means; and
   a second feedback path which connects said inverting input terminal of said second amplifier circuit with said output terminal of said second amplifier circuit.

4. An amplifier according to claim 3, in which said first feedback path further includes a voltage divider circuit which forms a part of said first filter circuit, said inverting input terminal of said second amplifier circuit being coupled with the output terminal of said first amplifier circuit through said divider circuit.

5. An amplifier according to claim 3, further comprising a second filter circuit connected between said output terminal of said first amplifier circuit and said inverting input terminal of said second amplifier circuit.

6. An amplifier according to claim 3, further comprising a second filter circuit which includes a divider circuit connected between said output terminal of said second amplifier circuit and a circuit ground, said output terminal of said second amplifier circuit is connected with said resistance means through said divider circuit.

7. An amplifier according to claim 3, further comprising a second filter circuit which includes a divider circuit connected between said output terminal of said second amplifier circuit and a circuit ground, said output terminal of said second amplifier circuit is connected with said resistance means through said divider circuit, said second feedback path including a third filter circuit.

* * * * *

UNITED STATES PATENT AND TRADEMARK OFFICE
CERTIFICATE OF CORRECTION

PATENT NO. : 4,222,012
DATED : September 9, 1980
INVENTOR(S) : Kenji Yokoyama

It is certified that error appears in the above—identified patent and that said Letters Patent is hereby corrected as shown below:

Column 1, line 17, change "-$\overline{en}$" to --$\overline{en}$--;

line 21, change "-" to --=--;

line 29, change "-$\overline{eni}$" to --$\overline{eni}$--;

Column 2, line 55 Equation (3) should be $$-- \quad i = \frac{Vs+Vi}{Ra} \quad --$$

line 59 Equation (4) should be $$-- \quad Zi = \frac{Vi}{i} = \frac{Ra \cdot Vi}{Vs+Vi} = \frac{Ra}{1+\frac{Vs}{Vi}}$$

Signed and Sealed this

Fourteenth Day of July 1981

[SEAL]

Attest:

GERALD J. MOSSINGHOFF

Attesting Officer     Commissioner of Patents and Trademarks